United States Patent
Hamanaka

(10) Patent No.: US 6,271,549 B1
(45) Date of Patent: Aug. 7, 2001

(54) PROCESS FOR FABRICATING A METAL SILICIDE LAYER OF A SEMICONDUCTOR AND APPARATUS

(75) Inventor: Nobuaki Hamanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/469,760

(22) Filed: Dec. 22, 1999

(30) Foreign Application Priority Data

Dec. 24, 1998 (JP) .................................... 10-366631

(51) Int. Cl.[7] .................................................. H01L 23/58
(52) U.S. Cl. ............................................ 257/253; 438/166
(58) Field of Search .................................. 438/308, 682, 438/907, 908, 166, 789, 618, 660, 688; 257/252, 253

(56) References Cited

U.S. PATENT DOCUMENTS 5,478,780 * 12/1995 Koerner et al. ...................... 437/190
5,599,741 * 2/1997 Matsumoto et al. .................. 437/192
5,817,549 * 10/1998 Yamazaki et al. .................... 438/166
6,001,727 * 12/1999 Ohmi et al. ........................... 438/618

FOREIGN PATENT DOCUMENTS 9-69497    3/1997  (JP) .

* cited by examiner

Primary Examiner—Matthew Smith
Assistant Examiner—Calvin Lee

(57) ABSTRACT

The magnetron sputtering apparatus of this invention has planar bodies 13 made of a material capable of capturing oxygen and water, heaters 14 to heat the planar bodies 13, an oxygen monitor 15 and others in a load lock chamber 11 and separate chamber 12. After a metal film has been formed on a silicon substrate 18 in a film forming chamber, the substrate is subjected to a heating treatment such that a metal silicide layer is formed. Before the silicon substrate being still hot is transferred to the load lock and separate chambers 11 and 12, oxygen and water in the same chambers have been removed. Through this arrangement it is possible to prevent oxidation of the metal silicide layer, and to form a high melting point silicide layer having a low resistance.

18 Claims, 9 Drawing Sheets

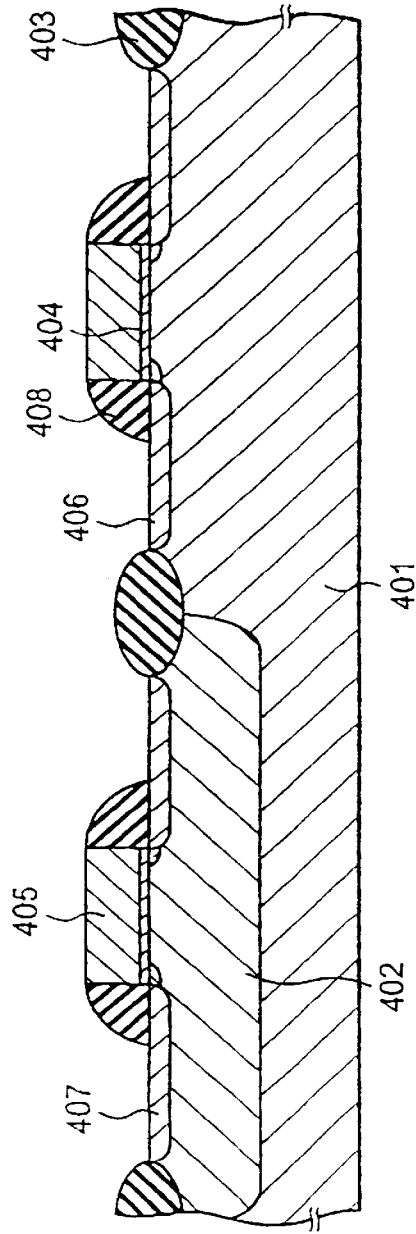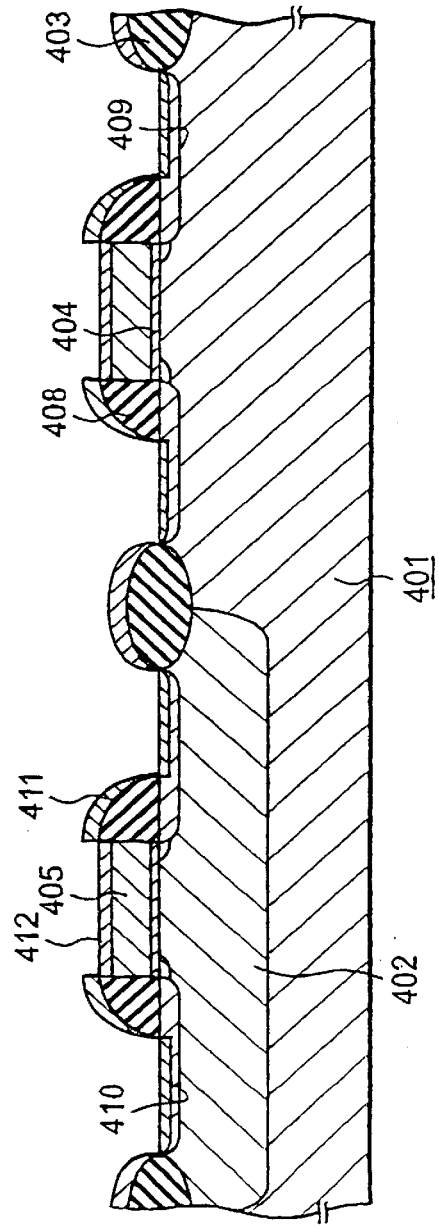
FIG.1(a) (Prior Art)
FIG.1(b) (Prior Art)

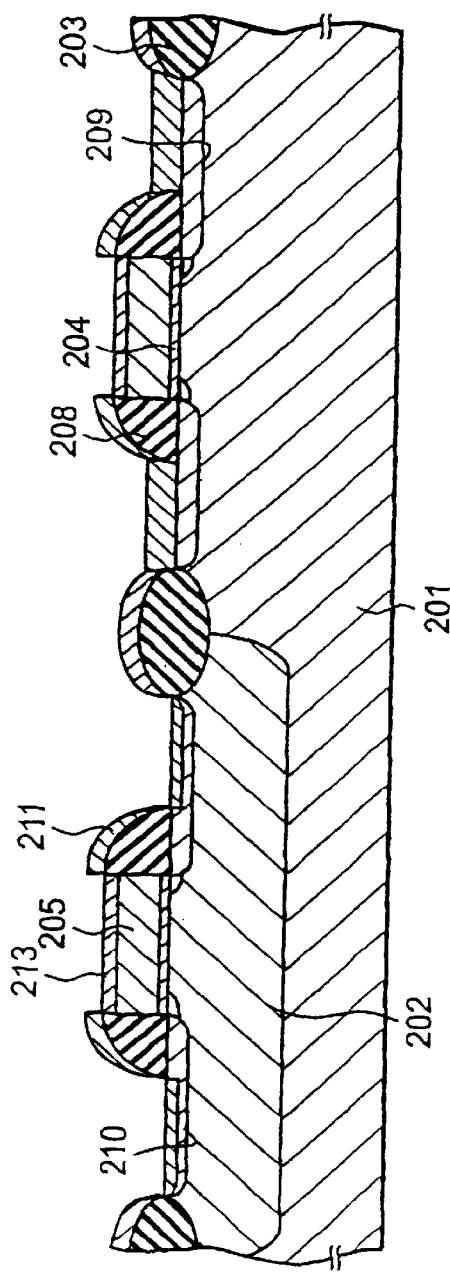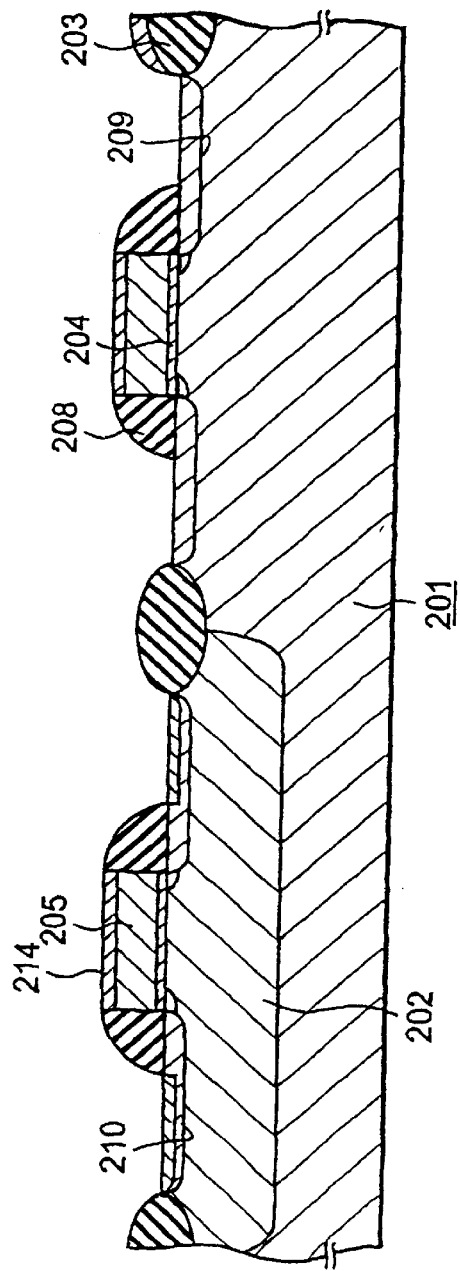

PROCESS FOR FABRICATING A METAL SILICIDE LAYER OF A SEMICONDUCTOR AND APPARATUS

BACKGROUND OF THE INVENTION

1. Field of the Related Art

The present invention relates to a semiconductor fabrication process for obtaining a metal silicide layer with a low resistance and uniform profile, and an apparatus therefor.

2. Description of the Invention

The self-aligned silicide process is a well-known fabrication process of MOS type field-effect transistors (MOSFET) whereby the surfaces of gate, source and drain are processed into suicides compatible to each other in a self-controlled manner, and at the same time reduction of the transverse resistance of a suicide layer (across-layer resistance) is achieved (see, for example, Japanese Patent Laid-Open No. 9-69497). This conventional process for fabricating semiconductors will be described with reference to FIGS. 1(a) to 1(d) which present the cross-sections of the product in order of fabrication procedures.

The first procedure is shown in FIG. 1(a). An N-well 402 is formed on a silicone substrate 401 by a conventional method. In the next step, a field oxide film 403 is formed by selective oxidation. On the active region surrounded by the field oxide films 403 are allowed to grow a gate insulating film 404 made of, for example, a silicon oxide film, and a polycrystalline silicon film to serve as a gate electrode 405 in order. In a further step, the polycrystalline silicon is doped with phosphor by a conventional method so that its electric resistance may be reduced. In a still further step, the polycrystalline silicon is pattern-etched by conventional methods such as photolithography and dry-etching, to form a gate electrode 405. In a still further step, N-type layers 406 doped with low-concentration impurities (N-type impurity layers) and P-type layers 407 doped with low-concentration impurities (p-type impurity layers) are formed. In a still further step, side-wall spacers 408 made of a silicon oxide film or silicon nitride film are formed on the lateral aspects of gate electrode 405 using known CVD and etching technologies.

The next procedure is shown in FIG. 1(b). Source/drain regions consisting of N-type impurity layers 406 and source/drain regions consisting of P-type impurity layers 407 are formed by photolithography and ion injection. Through those steps, an N-type source/drain region 409 and P-type source/drain region 410 having an LDD structure are formed. In the next step, naturally formed oxide films (not shown here) formed on the surfaces of polycrystalline silicon serving as gate electrode 405 and of silicone substrate 401 are removed. In a further step, cobalt, that is, a metal having a high melting point is allowed to deposit on the substrate 401 by sputtering using a magnetron sputtering apparatus while the substrate 401 is being heated at 200–500° C. (for example, 450° C.), thereby forming a cobalt film 411 thereupon. During this operation, the cobalt film 411 reacts with the gate electrode 405 and source/drain regions 409 and 410, to form a dicobalt monosilicide ($Co_2Si$) layer 412 there.

A further procedure is shown in the left-hand side of FIG. 1(c). The silicon substrate 401 is subjected to a rapid heating treatment (to be referred to as "RTA" hereinafter) which consists of heating the substrate to 500° C. or higher in nitrogen atmosphere so that the gate electrode 405 and source/drain regions 409 and 410 react with the dicobalt monosilicide layer to produce a cobalt monosilicide (CoSi) or cobalt disilicide ($CoSi_2$) layer. During this operation, part of cobalt films 411 in contact with the field oxide film 403 and side-wall spacers 408 is also oxidized.

A still further procedure is shown in the left-hand side of FIG. 1(d). The silicon substrate 401 is immersed into an aqueous solution of hydrochloric acid and hydrogen peroxide for selective wet etching, so that only unreacted cobalt films and cobalt films partly oxidized may be removed. In the next step, the substrate is subjected to RTA consisting of heating to a temperature higher than that of previous RTA, thereby forming a cobalt disilicide layer 414

FIG. 2 gives the flat view of a conventional sputtering apparatus. Operation of this apparatus will be described below with reference to FIG. 2.

As shown in FIG. 2, the currently commonly used sputtering apparatus has a multi-chamber structure in which a number of sputtering chambers 101 to 104, a load lock chamber 11 and a separate chamber 12 are combined. The sputtering chambers 101 to 104 are film forming chambers to achieve independent deposition of different materials. The load lock chamber 11 and separate chamber 12 form together a channel for transportation (those chambers are called together as "transportation chambers" hereinafter) through which a silicone substrate can be moved in and out of any one of sputtering chambers 101 to 104 while the substrate is kept in a vacuum. The load lock chamber 11 connects the separate chamber 12 with outside. The separate chamber 12 is connected to each of sputtering chambers 101 to 104 and to load lock chamber 11. For this reason, a silicone substrate 18 can move from one sputtering chamber to another as shorn by the interrupted line 181 of FIG. 2, while being safely protected by the load lock chamber 11 and separate chamber 12 against the exposure to the air.

The separate chamber 12 has a gate valve; the load lock chamber 11 has an air inlet valve; and the silicone substrate is fixed on a wafer holding/carrying arm.

Fabrication of an MOSFET transistor was undertaker using an apparatus as above. A substrate which had been given a gate electrode 405 made of polycrystalline silicon doped with boron ion at a high concentration of about $3\times10^{15}$ atoms/$cm^2$ had a cobalt film 411 formed thereupon with a conventional sputtering apparatus as shown in the left-hand side of FIG. 1(c). Then, after the surface of cobalt film 411 was turned into a cobalt silicide layer via RTA, the across-layer resistance of gate electrode 405 was measured. The across-layer resistance there was about 10 /xx.

The next procedure is shown in the right-hand side of FIG. 1(c). The silicon substrate 401 which have had N-type source/drain regions doped with arsenic ion at a high concentration of about $5\times10^{15}$ atoms/$cm^2$ had a cobalt film 411 formed thereupon by the conventional sputtering apparatus. The next step is shown in the right-hand side or FIG. 1(d). The surface of cobalt film 411 was turned into a cobalt silicide layer via RTA; and cobalt films 411 deposited on the side-wall spacers 408 and others were removed by wet etching. Subsequent to this step, foreign matters looking like elevated silicon mass appeared over N-type source/drain regions 409.

The foreign matter 415 may arise through the following mechanism. Firstly, while a cobalt film 411 is being formed by high temperature sputtering, dicobalt monosilicide formed on N-type source/drain regions 409 is oxidized. During this reaction, dicobalt monosilicide is split into cobalt oxides and silica or silicon dioxide, of which only cobalt oxides are removed by subsequent wet-etching. Thus remaining silica or silicon dioxide spreads and deposits over the surface of silicon substrate 401 to form elevations there which appear as a foreign matter 415.

With the conventional semiconductor fabrication process and apparatus therefor, particularly when it is applied for depositing a metal with a high melting point on the surface of a wafer to form a film with a layer of silicide of that metal thereupon by sputtering at a high temperature, the across-layer resistance of the film becomes high. This has been a problem.

It the same process is applied to a silicon substrate which has N-type source/drain regions doped with arsenic ion at a high concentration of $5 \times 10^{15}$ atoms/cm$^2$, foreign matters develop over the surface of silicide layer, to degrade the latter. This has been another problem.

These problems become increasingly serious as the interval between adjacent gate electrodes, source regions and drain regions becomes small in association with the compaction of transistors. In addition, silicon or silicon dioxide masses deposited on a substrate, if they are left to fly into the air, may contaminate nearby substrates as dust.

SUMMARY OF THE INVENTION

An object of this invention is to provide a semiconductor fabrication apparatus whereby it is possible to produce an MOSFET in which the across-layer resistance is more reduced than in a conventional apparatus.

Another object of this invention is to provide a method whereby it is possible to produce in a highly reproducible manner a semiconductor fabrication apparatus to form a film of a metal with a high melting point on a semiconductor.

A further object of this invention is to provide a semiconductor fabrication apparatus which insures a greatly improved yield of acceptable semiconductor products over that of a conventional apparatus.

A still further object of this invention is to provide a process for fabricating semiconductors whereby it is possible to form a metal silicide layer having a lower resistance than does a similar layer produced by a conventional method, without causing any foreign matters to develop on the silicon substrate, and an apparatus therefor.

The semiconductor fabrication process according to this invention comprises the steps of: forming a metal film on, for example, a silicon substrate in a film forming chamber; forming a metal silicide layer or a layer of a silicide compound of that metal by subjecting the substrate to a heating treatment; and transferring the substrate, while keeping it at a high temperature, to transportation chambers which have been removed of oxygen and water. In order to remove the transportation chambers of oxygen and water, for example, a planar body made of a material capable of capturing oxygen and water molecules is heated with a heater in the transportation chamber. For this purpose, it is preferred to install a heater in the transportation chamber and then to place a planar body just above the heater. The heating temperature of heater should be preferably set to 50° C. or higher, most preferably to not lower than 80° C. but not higher than 120° C. Normally, the temperature in question is set to around 100° C. Conventionally, the transportation chamber is set to room temperature, and the chamber is exhausted of air to give a pressure of around $10^{-7}$ Torr. For this reason, the transportation chamber of a conventional apparatus contains air whose oxygen and water contents are similar to those of the atmospheric air: the water content is about 0.5% and the oxygen content about 20%. One feature of this invention consists of reducing the contents of water and oxygen in air to levels equal to or less than half their normal values. The water content should preferably be reduced to one tenth of the normal level or less, and the oxygen content to one fourth of the normal level or less. If a material capable of capturing oxygen and water molecules given by this invention is used, such an atmosphere as defined above will be easily obtained.

The process by which to form a metal film on a semiconductor substrate for this invention may be performed by any known technique such as sputtering, vapor deposition, ion plating, etc. Formation of a metal film on a silicon substrate by sputtering using a separate chamber and load lock chamber (together they are called "transportation chambers" hereinafter) according to this invention will be explained below as an illustration.

The present inventors succeeded in delineating the factors responsible for the elevated resistance of a layer of a silicide compound of a metal with a high melting point, and for the degradation of surface profile of a silicide layer lying on N-type diffusion regions. Those problems are accounted for by the fact that, after a metal with a high melting point has been deposited on the surface of a silicon substrate at a high temperature, the substrate is transferred to the transportation chamber while it is still hot, and then part of a metal silicide layer newly formed is oxidized by oxygen and water molecules remaining in the air within the transportation chamber.

To avoid such a flaw and achieve the above objects, the present invention provides a semiconductor fabrication process in which a metal with a high melting point is deposited by high temperature sputtering on the surface of a silicon substrate which has gate electrodes serving as a semiconductor element formed on its entire surface; and the substrate is subjected to a heating treatment within a sputtering chamber so as to have a silicide layer of the metal with a high melting point formed thereupon to form an interface with the underlying metal with a high melting point, and a sputtering apparatus adapted for this process whose transportation chamber includes a thin plate composed of a material capable of capturing oxygen and water vapor, and a heater. The process is characterized by keeping in advance the partial pressure of oxygen of the atmosphere in the transportation chamber at an extremely low level, and then by moving a silicon substrate into a sputtering chamber for sputtering at a high temperature.

It should be noted here that the thin plate made of a material to capture oxygen and water, and the heater are placed close to the wall or ceiling of the transportation chamber of the sputtering apparatus. The thin plate is heated from its bottom surface with the heater.

The material to capture oxygen and other should preferably include a substance which is easily oxidized by oxygen remaining in the transportation chamber even at higher temperatures than room temperature, and will not form an inert compound on its surface upon oxidation, and thus will be ready to capture oxygen in the transportation chamber for an indefinite period. To put it more specifically, the material in question should preferably be the same with the metal to be deposited by sputtering on a substrate, or include such a metal as cobalt, nickel, zirconium, tantalum, niobium, copper, etc.

The sputtering apparatus should be preferably equipped in such a way as to measure the partial pressure of oxygen and the density of water vapor of an atmosphere close to the place in the transportation chamber where a silicon substrate is to be settled.

According to this invention, firstly the partial pressure of oxygen and the density of water vapor in the atmosphere of the transportation chamber is extremely reduced; then a silicon substrate is transferred to a sputtering chamber; and sputtering is performed at a high temperature. Through this arrangement it is possible to prevent the surface of a silicide layer of a metal with a high melting point formed by sputtering from being oxidized even when the substrate is transferred into the transportation chamber. As a result, the silicide layer has a lower resistance than would be otherwise observed.

This operation will be further described in detail below.

A silicon substrate was removed of naturally oxidized films formed thereupon via etching using an aqueous solution of hydrofluoric acid, and was transferred to a sputtering chamber where it received a deposition of cobalt through sputtering. In the next step, cobalt deposited on spacers and others was removed by the first heating treatment and wet etching. In a further step, the substrate was subjected to the second heating treatment, and transferred to a transportation chamber conventionally evacuated, and the across-layer resistance of P-type gate electrode measured. The resistance measurement was compared with the oxygen pressure of the atmosphere of the transportation chamber to which the substrate had been exposed.

The partial pressure of oxygen and density of water vapor of the air within the transportation chamber was extremely reduced according to this invention, and then another silicone substrate was transferred to a sputtering chamber to receive a deposition of cobalt through sputtering at a high temperature (process of this invention). The across-layer resistance of the resulting gate electrode was lower by about 10% than that of the foregoing gate electrode for which cobalt was sputtered at a high temperature without prior reduction of the oxygen partial pressure and water vapor density of the atmosphere of the transportation chamber (conventional process)

With this invention, even if a silicon substrate is transferred to the transportation chamber while it is still hot, the surface of dicobalt monosilicide ($Co_2Si$) layer derived from cobalt being sputtered at a high temperature will not undergo oxidation, as the partial pressure or oxygen and density of water vapor of the atmosphere of the transportation chamber have been kept extremely low in advance. The $Co_2Si$ layer, during the first heating treatment which takes place immediately thereafter, reacts with the silicon substrate, to turn into a cobalt monosilicide (CoSi) layer. This CoSi layer, even if submitted to subsequent steps including wet etching, will not dissolve into solutions, and thus a cobalt disilicide ($CoSi_2$) layer which is obtained after the CoSi layer has been processed in the subsequent steps including the second heating treatment will not suffer a loss in its thickness. This leads to the reduction of across-layer resistance of the silicide layer in question.

By contrast, with the conventional process, cobalt is sputtered at a high temperature so as to deposit on a substrate to form a metal silicide layer thereupon while the oxygen partial pressure and density of water vapor of the atmosphere of the transportation chamber are left uncontrolled. Therefore, when the silicon substrate is transferred to the transportation chamber while it is still hot, the surface of $Co_2Si$ layer will be oxidized, and a layer of cobalt oxide be formed there. This cobalt oxide layer will not undergo any reaction even when submitted to the first heating treatment, but will dissolve into solutions such as an etching solution in subsequent steps including wet etching. As a result, a $CoSi_2$ layer to be formed on the P type gate in the second heating treatment will suffer a loss in its thickness. This will lead to the elevation of across-layer resistance of the silicide layer in question.

According to this invention, a layer made of a silicide compound of a metal having a high melting point is formed on a silicon substrate provided with N-type source/drain regions doped with arsenal ion at a high concentration of $5\times10^{15}$ atoms/cm$^2$, and the silicide layer presents a stable profile free from any tears over the entire substrate surface.

By contrast, according to the conventional process, cobalt is deposited by sputtering at a high temperature on a substrate to form a metal silicide layer thereupon, and the resulting substrate is transferred, while being still hot, to a transportation chamber of whose atmosphere the partial pressure of oxygen and density of water vapor have been left uncontrolled. Therefore, during transportation, the surface of $CO_2Si$ layer undergoes oxidation, to form a cobalt oxide layer. This cobalt oxide layer will not undergo any reaction even when submitted to the first heating treatment, and will dissolve into solutions such as an etching solution in subsequent steps including wet etching. As a result, out of all the oxide compounds yielded by the original $Co_2Si$ layer undergoing oxidation, only silicon and silicon dioxide compounds that are insoluble to the solution used for wet etching will remain on N-type source/drain regions. These residual compounds will appear as protruding deposits developing over N-type source/drain regions.

The above and other objects, features and advantages of the present invention will be more apparent from the following description taken in conjunction with the accompanying drawings.

BRIEF DESCRIPTION OF THE DRAWINGS

FIGS. 1(a)–1(d) give sectional views of a semiconductor processed by a conventional method. Processing proceeds in the order of FIG. 1(a) through FIGS. 1(b) and 1(c) to FIG. 1(d).

FIGS. 4(a)–4(d) give the sectional views of a semiconductor processed by the method of this invention. Processing proceeds in the order of FIG. 4(a) through FIGS. 4(b) and 4(c) to FIG. 4(d).

DETAILED DESCRIPTION OF THE PREFERRED EMBODIMENTS

FIGS. 4(a)–4(d) give the sectional views of a semiconductor processed by the method of this invention. Explanation of the manner how the semiconductor is processed by the method of this invention will be given below with reference to these figures.

Figure 4A:
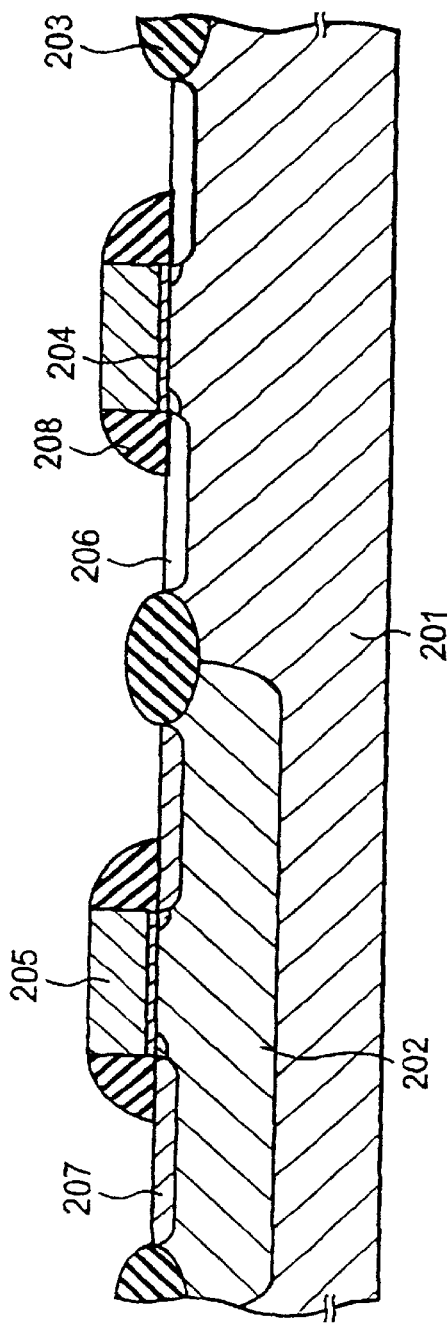

The first procedure is shown in FIG. 4(a). An N-well 202 is formed on a silicone substrate 201 by a known method. In the next step, a field oxide film 203 is formed by selective oxidation. In a further step, on the active region surrounded by the field oxide films 203 are allowed to grow a gate insulating film 204 made of, for example, a silicon oxide film, and a polycrystalline silicon film to serve as a gate electrode 205 in order. In a still further step, the polycrystalline silicon is doped with impurities by a known method so that its electric resistance may be reduced. In a still further step, the polycrystalline silicon is pattern-etched by known methods such as photolithography and dry-etching, to form a gate electrode 205. In a still further step, N-type layers 206 doped with low-concentration impurities (N-type impurity layers) and P-type layers 207 doped with low-concentration impurities (P-type impurity layers) are formed. In a still further step, side-wall spacers 208 made of a silicon oxide film or silicon nitride film are formed on the lateral aspects of gate electrode 205 using known CVD and etching technologies.

The next procedure is shown in Fig. 1(b). Source/drain regions consisting or N-type impurity layers and source/drain regions consisting of P-type impurity layers are formed by photolithography and ion injection. Through those steps, an N-type source/drain region 209 and P-type source/drain region 210 having an LDD structure are formed. In the next step, naturally formed oxide films (not shown here) formed on the surfaces of polycrystalline silicon serving as gate electrode 205 and of silicone substrate 201 are removed. In a further step, cobalt, that is, a metal having a high melting point is allowed to deposit on the substrate 201 by sputtering using a magnetron sputtering apparatus while the substrate 201 is being heated at 200–500° C. (for example, 450° C.), thereby forming a cobalt film 211 thereupon. During this operation, the cobalt film 211 reacts with the gate electrode 205 and source/drain regions 209 and 210, to form dicobalt monosilicide ($Co_2Si$) films 212 there.

Subsequent to this procedure, the silicon substrate 201 is transferred to the load lock chamber of a magnetron sputtering apparatus, and air within that chamber is exhausted with a cryostat vacuum pump so that gas within the load lock chamber may take a total pressure of $1\times10^{-6}$ Torr or lower. Then, thin plates attached to the walls of the separate chamber and load lock chamber (transportation chambers) of the sputtering apparatus are heated with heaters. The thin plate is made of a material (e.g., cobalt) which is readily oxidized by oxygen and water vapor. The heaters are placed in such a manner as to heat the plates from their bottom sides (from the wall side).

Through the above procedure, oxygen and water vapor remaining in the load lock and separate chambers are consumed as a result of oxidation of the thin plates. Consequently, the partial pressure of oxygen and density of water vapor of the atmosphere within the transportation chamber declines extremely. The partial pressure of oxygen and density of water vapor can be measured with an oxygen partial pressure monitor placed in the transportation chamber for this purpose. it should be noted here that the thin plate undergoing oxidation during the above procedure will not develop an inert compound on its surface, and that the resulting oxide compound will have only a small thickness as compared with that of the thin plate. For this reason, replacement of the thin plates will occur infrequently.

Figure 4B:
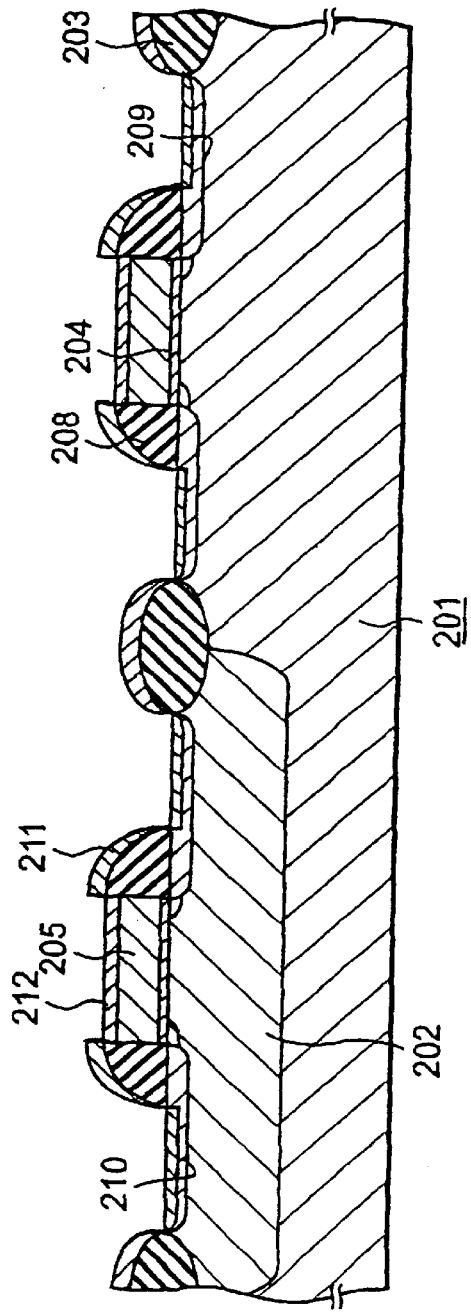

After confirming by reading out the oxygen pressure monitor that the partial pressure of oxygen is reduced to a sufficiently low level, the silicon substrate 201 is transferred to a sputtering chamber. Then, a cobalt film 211 is formed on the substrate by sputtering deposition. During this process, the cobalt film 211 in contact with the gate electrode 205 and source/drain regions 209 and 210 undergoes reaction, and a dicobalt monosilicide layer 212 is formed concurrently. With this method of present invention, even when the substrate 201 having just received sputtering deposition at a high temperature, and is transferred again to the separate and load lock chambers, the cobalt film 211 and dicobalt monosilicide layer 212 deposited on the silicon substrate 201 as depicted in FIG. 4(b) will not undergo oxidation, because the partial pressure of oxygen and density of water vapor of the atmosphere within those chambers are kept extremely low. In this example, the film deposited by sputtering is made of cobalt, but the same advantage will be obtainable if nickel, iron or others is used instead of cobalt.

Figure 1C:
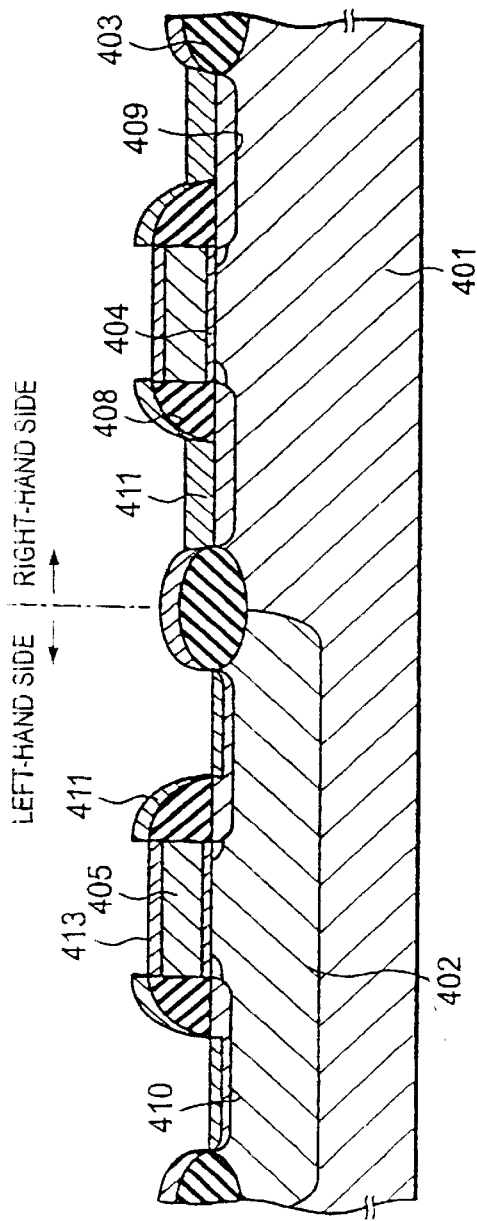
Figure 1D:
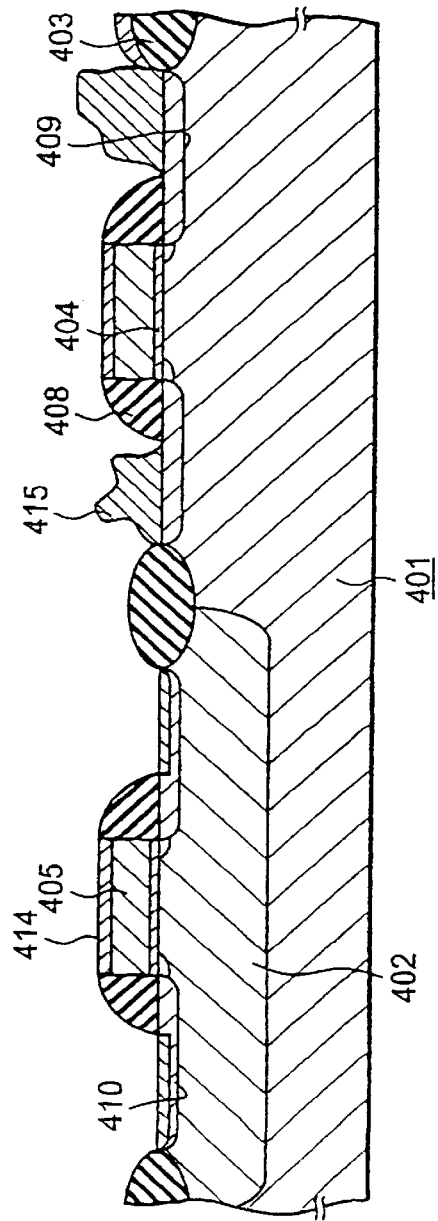

A further procedure is shown in FIG. 1(c). The silicon substrate 201 is subjected to RTA: the substrate is heated at a temperature of 500° C. or higher in nitrogen atmosphere. Through this treatment only the monosilicide layer 212 in contact with the gate electrode 205 and source/drain regions 209 and 210 turn into a cobalt monosilicide or cobalt disilicide layer 213. During this process, part of cobalt films 211 in contact with the field oxide film 203 and side-wall spacers 208 is also oxidized.

A still further procedure is shown in FIG. 4(d). The silicon substrate 201 is immersed into an aqueous solution of hydrochloric acid and hydrogen peroxide for selective wet etching, so that only unreacted cobalt films 211 and cobalt films partly oxidized 211 may be removed. In the next step, the substrate is subjected to RTA consisting of heating to a temperature (e.g., 800° C.) higher than that of previous RTA, thereby forming a Cobalt disilicide layer 214.

The cobalt disilicide layers 214 deposited in a self-controlled manner on P-type source/drain regions 210, N-type source/drain regions 209, N-type gate electrode 205 and P-type gate electrode 205 of an MOSFET prepared by the above process present a surface excellent in profile, and have a reduced resistance. The reason is ascribed to the fact that the oxygen and water vapor remaining in the transportation chamber of the sputtering apparatus are kept extremely low, and thus the dicobalt monosilicide layer can avoid oxidation.

The above example represents a method whereby cobalt disilicide layers are formed over a gate electrode and diffusion layers. However, the method of this invention obviously applies also to the following products: a product where nickel, iron or titanium instead of cobalt is used as a metal with a high melting point to be deposited by sputtering to form a silicide layer; a product containing a poly-metal gate or metal gate where a metal with a high melting point is deposited by sputtering on the gate electrode; a product containing a capacitor where a metal such as ruthenium is deposited by sputtering on the capacitor electrode; and others.

Figure 2:
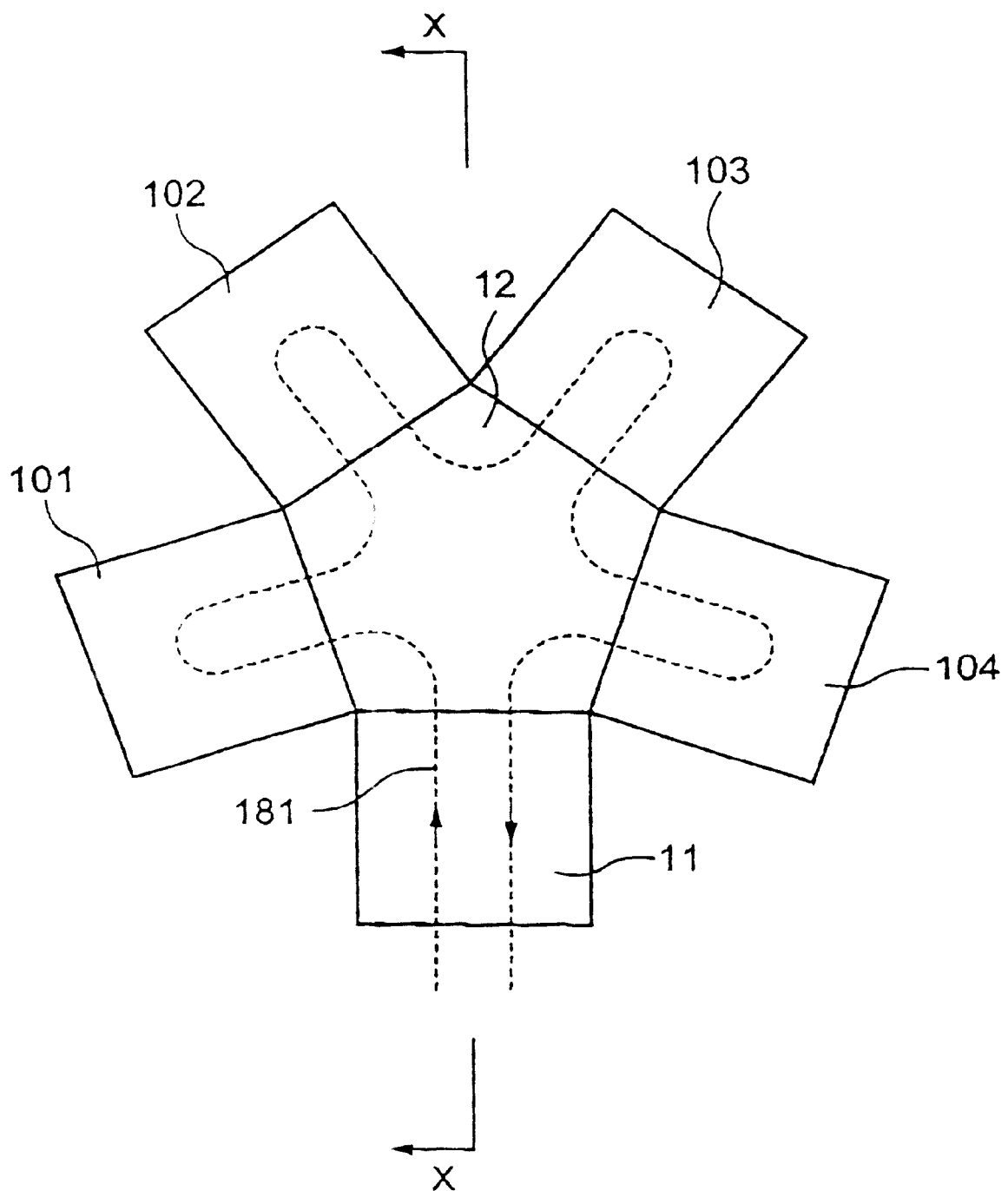
FIG. 2 gives the flat view of a conventional sputtering apparatus.
Figure 3:
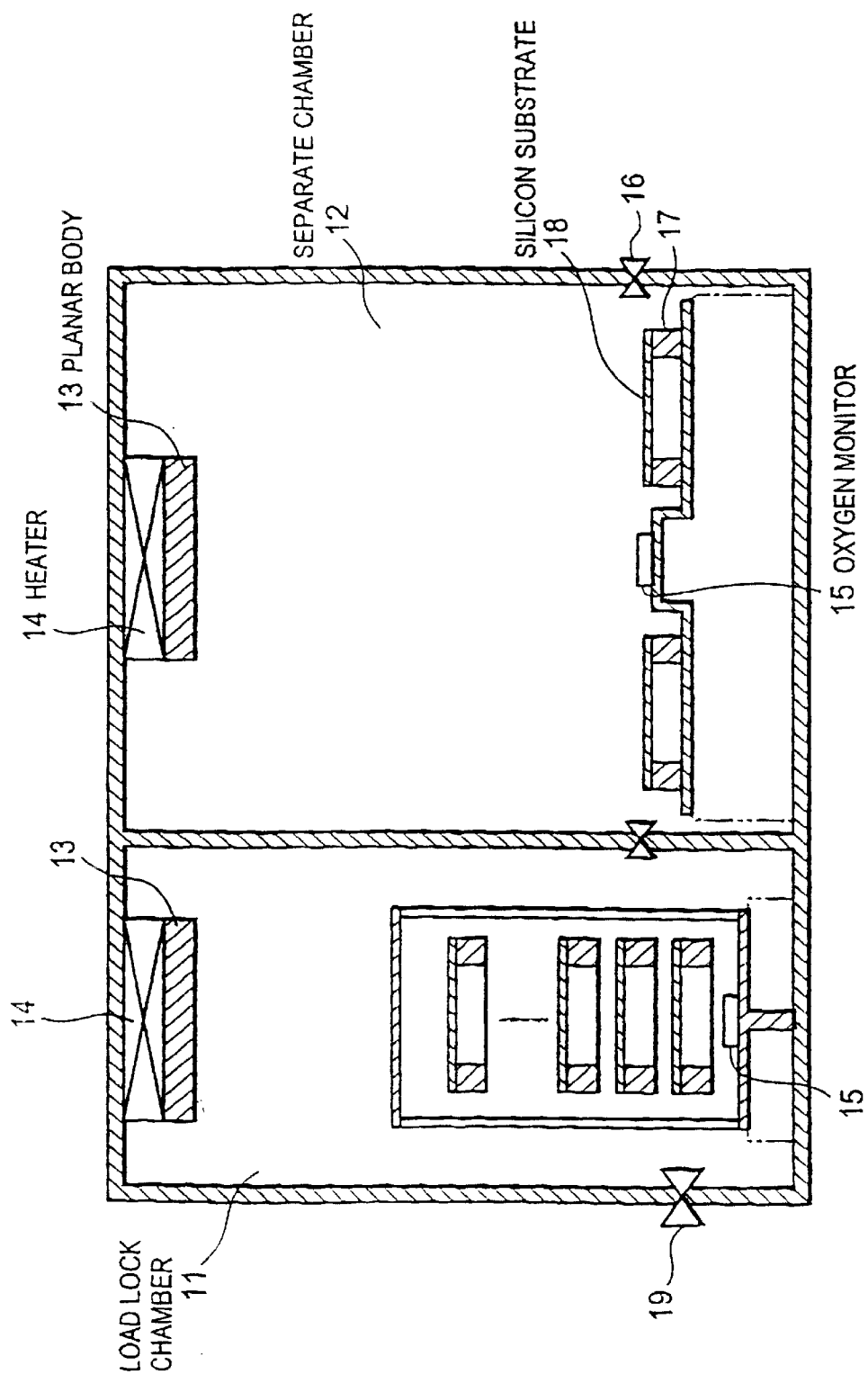
FIG. 3 gives the sectional view of a semiconductor fabrication apparatus representing an example of this invention.

FIG. 3 gives the sketchy sectional view of a semiconductor fabrication apparatus representing an example of this invention. Explanation of the manner how this apparatus is used according to this invention will be given below with reference to this figure. However, the same parts with those in FIG. 2 are represented by the same symbols, and explanation thereof will be omitted.

This example represents a semiconductor fabrication apparatus of this invention attached to a magnetron sputtering apparatus. As shown in FIG. 3, the apparatus representing an example of this invention to be attached to a magnetron sputtering apparatus has planar bodies 13 made of a material capable of capturing oxygen and water, heaters 14 to heat the planar bodies, and an oxygen monitor 15 in load lock and separate chambers 11 and 12.

The planar body 13 and heater 14 are installed in order to capture oxygen and water molecules in those chambers. The planar bodies 13 are attached to the ceiling or side wall of the load lock and separate chambers 11 and 12. To the back side (side facing the ceiling or side wall) of the planar body is attached the heater 14. Incidentally, an oxygen monitor 15 should be preferably installed that monitors the partial pressure of oxygen and density of water vapor of the space close to the place where a silicon substrate 18, after having a metal silicide layer (not shown here) formed by high temperature sputtering, is to be placed, in order to check the oxidation of that silicide layer.

The planar body 13 should preferably take a form of thin plate that has a large surface area relative to its volume. The heater 14 may be a resistance which develops heat by passing electric current. The oxygen monitor 15 may be, for example, a gas inlet leading to a mass filter.

The results of experiment where the magnetron sputtering apparatus representing an example of this invention was applied for fabrication of a semiconductor will be presented below.

To an apparatus (Anerpa, Model No. 1-1060) were mounted planar bodies made of a material capable of capturing oxygen and water vapor, heaters to heat the planar bodies, and an oxygen monitor, to obtain a magnetron sputtering apparatus according to this invention (to be referred to as "experimental apparatus" hereinafter). Sputtering experiment was undertaken using this experimental apparatus.

The materials of product, planar body and heater were chosen as follows:
  Material to be deposited by sputtering, cobalt;
  Size of wafer, 200 mm in diameter;
  Material of planar body, cobalt; and
  Thickness of planar body, 3 mm.

The experimental apparatus was so set as to deposit by sputtering a cobalt film on a gate electrode and diffusion layers of a silicon substrate under following conditions.
For the transportation chamber:
  Heater temperature, 100° C.;
  Internal gas pressure of load lock chamber, $1 \times 10^{-6}$ Torr;
  Heating time in load lock chamber, 1–20 min;
  Internal gas pressure of load lock chamber, $4 \times 10^{-8}$ Torr; and
  Heating time in separate chamber, 1–20 min.
For sputtering:
  Holding temperature, 200–450° C.;
  Pressure in the chamber, 3–8 mTorr;
  Heating time, 1–5 min; and
  Film thickness, 10 nm.

Figure 5:
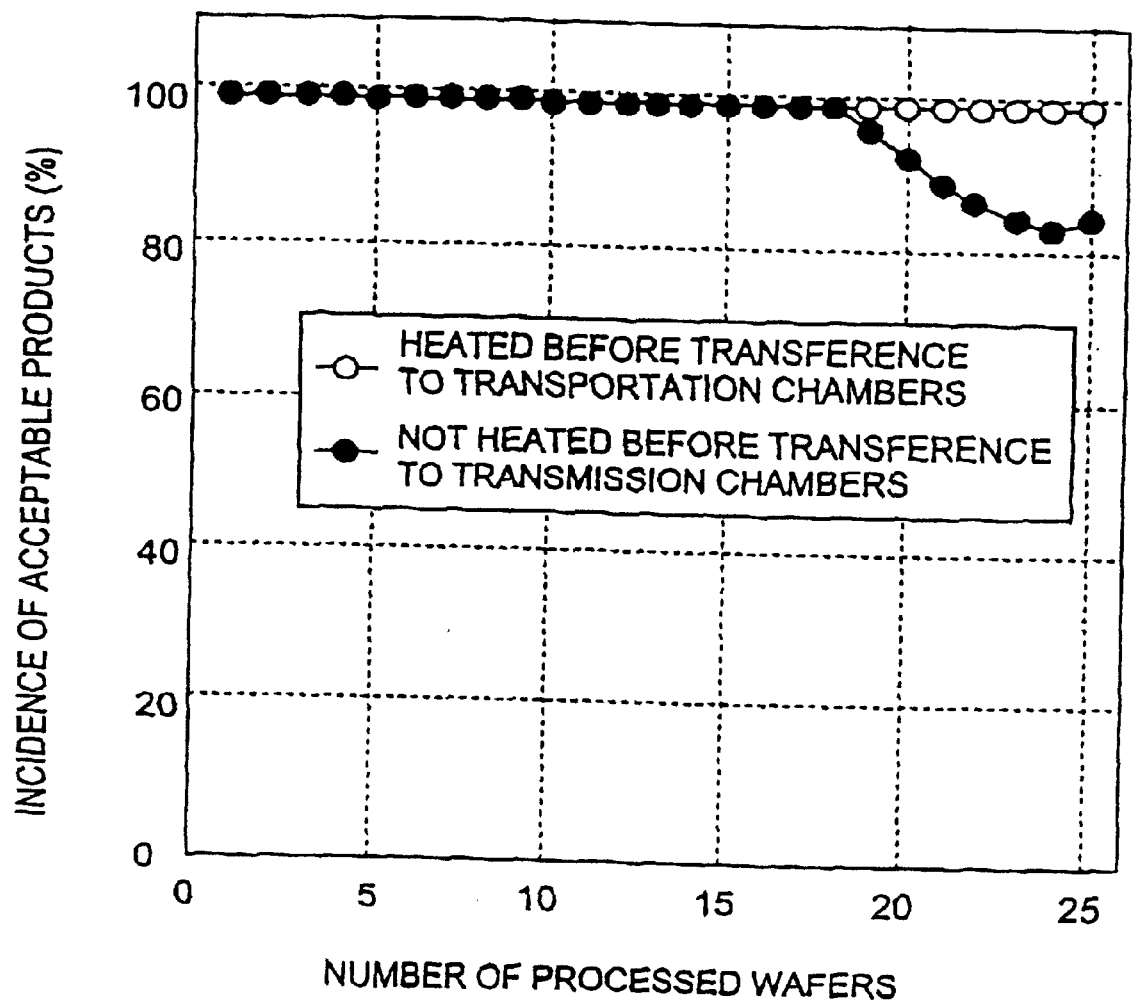
FIG. 5 gives graphs showing the incidences of acceptable chips as a function of the number of wafers processed by a conventional method (solid circles) and by the method of this invention (open circles).

In the next step, the surface profile of silicide layer formed on N-type diffusion layers was checked for each wafer. FIG. 5 plots the incidence (yield) of acceptable products on the ordinate, and the treated number of wafers on the abscissa. As a comparison, it also plots the same results when sputtering was made with an apparatus which had no planar body and heater in its transportation chambers.

If sputtering is performed with an apparatus which has no planar body and heater in its transportation chambers, the transportation chambers are warmed by the heat carried by a wafer, and thus residual moisture in the transportation chambers tend to vaporize. Then, as seen from FIG. 5, as the number of processed wafers increases, silicon substrates developing failed surface profiles as a result of oxidation tend to grow in number (solid circles). By contrast, when sputtering is performed with an apparatus which has planar bodies and heaters in its transportation chambers, and takes place subsequent to heating, failed surface profiles will not appear no matter how many wafers may be processed, even when the transportation chambers are kept high in temperature (open circles).

Figure 6:
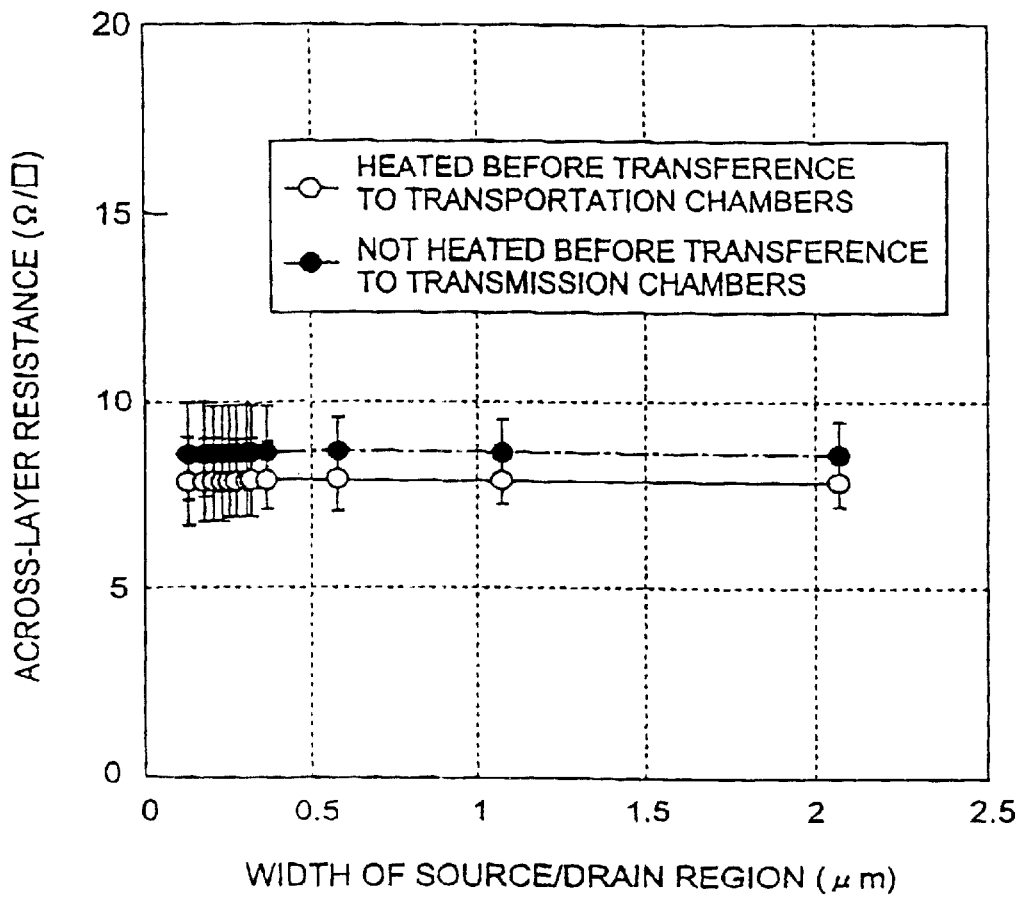
FIG. 6 gives graphs showing the across-layer resistances of cobalt silicide layers prepared by a conventional method (solid circles) and by the method of this invention (open circles) as a function of the width of source/drain region. Both the across-layer resistances of silicide layers prepared by the conventional method and by the present method are constant, being independent of the width of source/drain region, but the former is higher by about 10% than the latter.
Figure 7:
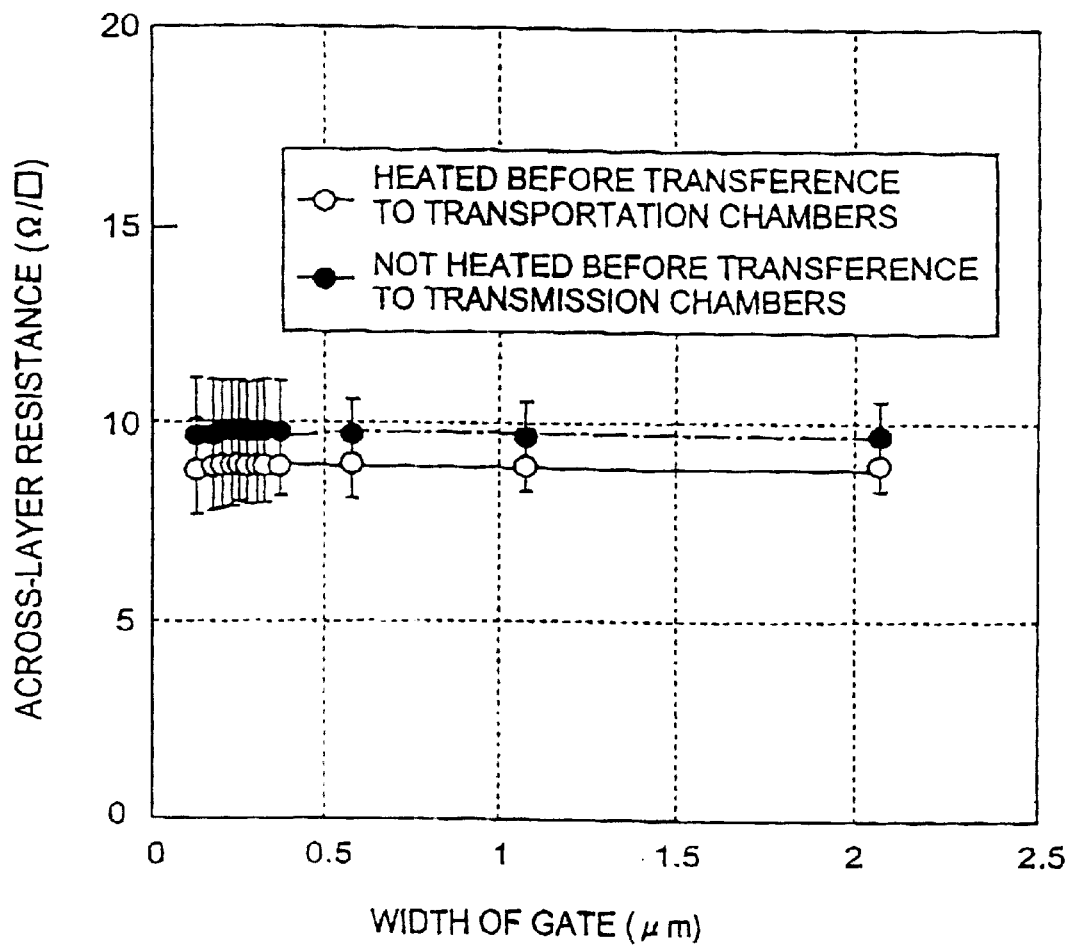
FIG. 7 gives graphs showing the across-layer resistances of cobalt silicide layers prepared by a conventional method (solid circles) and by the method of this invention (open circles) as a function of the width of gate. Both the across-layer resistances of silicide layers prepared by the conventional method and by the present method are constant, being independent of the width of gate, but the former is higher by about 10% than the latter.

Under the same experimental conditions as described above, the across-layer resistances on the gate electrode and diffusion layer were measured. FIGS. 6 and 7 plot the resistances on the gate electrode (FIG. 6) and on the source/drain region (FIG. 7) on the ordinate, and the widths of gate electrode (FIG. 6) and source/drain region (FIG. 7) on the abscissa. As a comparison, the same results when sputtering was made with an apparatus which had no planar body and heater in its transportation chambers are also plotted in the respective figures.

If sputtering is performed with an apparatus which has no planar body and heater in its transportation chambers, thee transportation chambers are warmed by the heat carried by a wafer, and thus residual moisture in the transportation chambers tend to vaporize. Then, as seen from FIGS. 6 and 7, the across-layer resistance tends to rise as a result of oxidation of the surface of silicon substrate (solid circles).

According to the semiconductor fabrication process of this invention and apparatus therefor, a metal film is formed on a silicon substrate in a film forming chamber; then a metal silicide layer is formed via a heating treatment; before the silicon substrate being still hot is transferred to transportation chambers, oxygen and water vapor in the transportation chambers have been removed in advance; and thus the metal silicide layer is prevented from being oxidized even when it is carried into the transportation chambers. Accordingly, it is possible to prevent the development of foreign matters on the surface or silicon substrate, and thus to obtain a suicide layer of a metal with a high melting point giving a lower resistance than does a similar layer of a conventional semiconductor product.

In another aspect, when the semiconductor fabrication process of this invention is applied to insert a silicide layer of a metal with a high melting point between insulating films selectively formed on a semiconductor substrate, it is possible to safely protect the silicide layer formed by high temperature sputtering against oxidation. Thus, it is possible to obtain an MOSFET having a low resistance. In a further aspect, tears of silicide layers over N-type source/drain regions which have been a problem with regard to conventional semiconductors are also safely prevented. This makes it possible to effectively arrange low resistance MOSFETs on a silicon substrate uniformly, which will lead to a great improvement in the yield of acceptable products.

What is claimed is:

1. A semiconductor fabrication apparatus comprising:
  sputtering chambers,
  a transportation chamber through which a semiconductor substrate can be moved in and out of any one of said sputtering chambers while said semiconductor substrate is kept in a vacuum,
  wherein oxygen and water in said transportation chamber have been removed in advance from said transportation chamber, and wherein said transportation chamber includes a thin plate made of a material capable of capturing oxygen and water vapor, and a heater.

2. A semiconductor fabrication apparatus as described in claim 1, wherein removal of oxygen and water in said transportation chamber is achieved by heating said thin plate.

3. A semiconductor fabrication apparatus as described in claim 1 wherein the thin plate is in a planar form, and is placed just above said heater.

4. A semiconductor fabrication apparatus as described in claim 1, wherein said thin plate is one chosen from cobalt, nickel and iron.

5. A semiconductor fabrication apparatus as described in claim 1, wherein said thin plate includes at least one chosen from cobalt, nickel, zirconium, tantalum, niobium and copper.

6. A semiconductor fabrication apparatus as described in claim 1, wherein said sputtering chambers are multi-chamber structure.

7. A semiconductor fabrication apparatus comprising:
- a transportation chamber wherein a semiconductor substrate to be processed is temporarily stored; and
- a sputtering chamber coupled to said transportation chamber to receive said semiconductor substrate from said transportation chamber and to deposit a metal on said semiconductor substrate,
- wherein said transportation chamber includes therein such a plate that is made of material capable of capturing at least one substance of the group of substances consisting of oxygen and water vapor.

8. The semiconductor fabrication apparatus as claimed in claim 7, wherein said transportation chamber further includes therein a heater, said heater coupled to heat said plate.

9. The semiconductor fabrication apparatus as claimed in claim 7, wherein said plate is made of any one substance of the group of substances consisting of cobalt, nickel, zirconium, tantalum, niobium, and copper.

10. The semiconductor fabrication apparatus as described in claim 7, wherein said plate is made of said metal.

11. The semiconductor fabrication apparatus as described in claim 7, wherein said metal is a high melting point metal.

12. A semiconductor fabrication apparatus comprising:
- a load lock chamber coupled to receive a semiconductor wafer thereinto from an outside of said apparatus;
- a separate chamber coupled to said load lock chmber to receive said semiconductor wafer from said load lock chamber; and
- a sputtering chmaber coupled to receive said semiconductor wafer from said separate chamber and to deposit a metal layer on said semiconductor substrate,
- wherein at least one of said load lock chmber and said separate chamber includes therein such a plate that is made of a material capable of at least one of or both of capturing oxygen and water vapor.

13. The semiconductor fabrication apparatus as claimed in claim 12, wherein said plate is coupled to a heater heating said plate.

14. The semiconductor fabrication apparatus as claimed in claim 13, wherein said plate is made of any one substance of the group of substances consisting of cobalt, nickel, zirconium, tantalum, niobium, and copper.

15. The semiconductor fabrication apparatus as claimed in claim 13, wherein said metal is a high melting point metal.

16. The semiconductor fabrication apparatus as claimed in claim 12, wherein said plate is made of said metal.

17. The semiconductor fabrication apparatus as claimed in claim 12, wherein said metal is a high melting point metal.

18. The semiconductor fabrication apparatus as claimed in claim 12, wherein said plate is provided in both of said separate chamber and said load lock chmaber.

* * * * *